(12) United States Patent
Nishino et al.

(10) Patent No.: US 9,276,189 B2
(45) Date of Patent: Mar. 1, 2016

(54) THERMOELECTRIC MATERIAL AND METHOD FOR GENERATING ELECTRICITY

(75) Inventors: Yoichi Nishino, Nagoya (JP); Suguru Tanaka, Hadano (JP)

(73) Assignee: NATIONAL UNIVERSITY CORPORATION NAGOYA INSTITUTE OF TECHNOLOGY, Nagoya (JP)

(*) Notice: Subject to any disclaimer, the term of this patent is extended or adjusted under 35 U.S.C. 154(b) by 246 days.

(21) Appl. No.: 13/820,786

(22) PCT Filed: Sep. 7, 2011

(86) PCT No.: PCT/JP2011/070332
§ 371 (c)(1),
(2), (4) Date: Mar. 18, 2013

(87) PCT Pub. No.: WO2012/033116
PCT Pub. Date: Mar. 15, 2012

(65) Prior Publication Data
US 2013/0167893 A1    Jul. 4, 2013

(30) Foreign Application Priority Data
Sep. 9, 2010   (JP) .................. 2010-201983

(51) Int. Cl.
*H01L 35/20*   (2006.01)
*H01L 35/32*   (2006.01)
(Continued)

(52) U.S. Cl.
CPC ........... *H01L 35/32* (2013.01); *C22C 38/06* (2013.01); *C22C 38/12* (2013.01); *H01L 35/20* (2013.01)

(58) Field of Classification Search
CPC ................................. H01L 35/12; H01L 35/14
USPC ................................. 136/236.1, 240
See application file for complete search history.

(56) References Cited

U.S. PATENT DOCUMENTS 5,959,240 A    9/1999   Yoshida et al.
6,069,312 A *  5/2000   Fleurial et al. ............ 136/236.1

FOREIGN PATENT DOCUMENTS

JP   A-10-163538   6/1998
JP   4035572   *   3/2003   .............. H01L 35/14
(Continued)

OTHER PUBLICATIONS

Nishino et al., "Effect of Off-Stoichiometry on the Transport Properties of the Heusler-Type Fe$_2$VA l Compound," *Physical Review B*, vol. 63, 2001, pp. 233303-1-233303-4.
(Continued)

*Primary Examiner* — Jennifer Michener
*Assistant Examiner* — Bethany L Martin
(74) *Attorney, Agent, or Firm* — Oliff PLC (57) ABSTRACT

A thermoelectric material has a Heusler alloy type crystal structure and is based on an Fe$_2$VAl basic structure having a total number of valence electrons of 24 per chemical formula. The thermoelectric material has a structure expressed by General Formula Fe$_2$V$_{1-z}$Al$_{1+z}$, where $0.03 \le z \le 0.12$, or General Formula Fe$_2$V$_{1-z}$Al$_{1+z}$, where $-0.12 \le z \le -0.03$, by controlling its chemical compositional ratio. The former acts as a p-type material and has a Seebeck coefficient whose absolute value reaches a peak at a temperature of 400 K or higher; and the latter acts as an n-type material and has a Seebeck coefficient whose absolute value reaches a peak at a temperature of 310 K or higher.

6 Claims, 5 Drawing Sheets

(51) Int. Cl.
*C22C 38/06* (2006.01)
*C22C 38/12* (2006.01)

(56) References Cited

FOREIGN PATENT DOCUMENTS

| JP | 2004-253618 | 9/2004 |
| JP | A-2009-87984 | 4/2009 |
| WO | WO 03/019681 A1 | 3/2003 |
| WO | WO 2007/108176 A1 | 9/2007 |

OTHER PUBLICATIONS

Dec. 10, 2013 Extended European Search Report issued in European Application No. 11823590.2.
Matsuura et al., "Doping Effects on Thermoelectric Properties of the Pseudogap $Fe_2VAl$ System," *J. Japan Inst. Metals,* vol. 66, No. 7, pp. 767-771, 2002 (with abstract).
Dec. 13, 2011 International Search Report issued in International Patent Application No. PCT/JP2011/070332 (with translation).

* cited by examiner

FIG.9

THERMOELECTRIC MATERIAL AND METHOD FOR GENERATING ELECTRICITY

TECHNICAL FIELD

The present invention relates to a thermoelectric material.

BACKGROUND ART

Thermoelectric materials (thermoelectric conversion material) belong to materials that convert thermal energy to electrical energy. The thermoelectric materials are roughly categorized as two types, i.e., n-type and p-type materials. Such n-type and p-type thermoelectric materials, when alternately connected in series electrically and arranged in parallel thermally, give a thermoelectric conversion element. The thermoelectric conversion element, when receiving a temperature difference between both sides thereof, can generate electricity. The thermoelectric conversion element, when receiving a voltage between both terminals thereof, generates a temperature difference.

Exemplary common thermoelectric materials include Bi—Te intermetallic compounds. The compounds are widely used because of having a high Seebeck coefficient, namely, having relatively good electric generation efficiency (Non Patent Literature (NPL) 1). Exemplary general thermoelectric materials further include Pb—Te intermetallic compounds and Zn—Sb intermetallic compounds; and thermoelectric materials other than intermetallic compounds, such as oxide thermoelectric materials (NPL 1).

The present inventors have proposed a thermoelectric material in Patent Literature (PTL) 1. This thermoelectric material has a Heusler alloy type crystal structure and has a structure corresponding to a basic structure having a total number of valence electrons of 24 per chemical formula. The thermoelectric material has a total number of valence electrons per chemical formula controlled by controlling its chemical compositional ratio without substituting another element for part of a constitutional element, or by substituting another element for part of a constitutional element. An exemplary basic structure listed in the literature is $Fe_2VAl$. An exemplary thermoelectric material whose compositional ratio is controlled without substituting for part of a constitutional element is one expressed by $(Fe_{2/3}V_{1/3})_{3-n}Al_{1+n}$, where n is −0.048 to 0.052. This compound has a total number of valence electrons of 23.79 to 24.19 (Experimental Example 1 in PTL 1).

In addition, the present inventors have proposed another thermoelectric material in PTL 2. This thermoelectric material has a structure based on an $Fe_2VAl$ basic structure, except for substituting another element for part of a constitutional element and adjusting, for example, an atomic weight of the other element to substitute.

The $Fe_2VAl$-based thermoelectric materials according to these proposals act as n-type materials when having a total number of valence electrons of 24 or more; and act as p-type materials when having a total number of valence electrons of 24 or less. Typically, an n-type $Fe_2V(Al_{1-\alpha}M_\alpha)$, where M is Si, Ge, or Sn, and $0<\alpha<1$, having a total number of valence electrons of 24 or more has a large Seebeck coefficient of about −120 μV/K (PTL 1, PTL 2, and NPL 2). In contrast, a p-type $Fe_2(V_{1-\alpha}M_\alpha)Al$, where M is Ti and $0<\alpha<1$, having a total number of valence electrons of 24 or less has a Seebeck coefficient of about +80 μV/K (PTL 1 and NPL 3).

Of thermoelectric materials, those having better electric generation efficiency have been demanded. To meet this demand, the present inventors have proposed a thermoelectric material having a structure based on an $Fe_2VAl$ basic structure, except for substituting other elements for at least part of Fe and V in PTL 3.

In the thermoelectric material just mentioned above, an element $M_1$, when defined as another element substituting for Fe, is selected from the group consisting of elements of Groups 7 to 10 in Periods 4 to 6 in the Periodic Table; and an element $M_2$, when defined as another element substituting for V, is selected from the group consisting of elements of Groups 4 to 6 in Periods 4 to 6 in the Periodic Table. The thermoelectric material has amounts α and β of substituting elements $M_1$ and $M_2$, which amounts satisfy General Formula $(Fe_{1-\alpha}M_{1\alpha})_2(V_{1-\beta}M_{2\beta})Al$ and are controlled within ranges of $0<\alpha<1$ and $0<\beta<1$. The thermoelectric material is controlled to act as a p-type material by having a total number of valence electrons of less than 24 per chemical formula; or is controlled to act as an n-type material by having a total number of valence electrons of more than 24 per chemical formula. Typically, a thermoelectric material including Ir as element $M_1$ and Ti as element $M_2$ has a Seebeck coefficient of about +90 μV/K and has a higher power factor and a higher figure of merit than those of a thermoelectric material substituting only Ti as $M_2$.

CITATION LIST

Patent Literature

[PTL 1]
PCT International Publication Number WO2003/019681
[PTL 2]
Japanese Patent Application Publication No. JP-A-2004-253618
[PTL 3]
PCT International Publication Number WO2007/108176

Non-Patent Literature

[NPL 1]
"New Textbook Series; Thermoelectric Energy Conversion-Theory and Applications-", edited by M. SAKATA, SHOKABO PUBLISHING Co., Ltd., (2005), 96-97
[NPL 2]
"Thermoelectric Properties of Pseudogap Heusler Compounds", Y. NISHINO, Materia Japan, 44(8) (2005), 648-653
[NPL 3]
"Doping Effects on Thermoelectric Properties on Pseudogap $Fe_2VAl$ alloy", H. Matsuura, Y. Nishino, U. Mizutani, and S. Asano, J. Japan Inst. Metals 66(7) (2002), 767-771

SUMMARY OF INVENTION

Technical Problem

Thermoelectric materials, when to be applied to power generators using waste heat, such as engines for automobiles and motorcycles, household fuel cells and gas cogeneration systems, should exhibit satisfactory electric generation efficiency at intermediate temperatures ranging from 500 K to 700 K.

However, the thermoelectric materials including Bi—Te intermetallic compounds are known to have a not-so-high Seebeck coefficient at intermediate temperatures ranging from 500 K to 700 K, although having a high Seebeck coefficient in the vicinity of room temperature. The thermoelectric materials not only invites high cost because of employing expensive metals Bi and Te as constitutional elements, but also places a heavy load on the environment because of employing toxic Se and Te, which Se is added to allow the material to act as an n-type thermoelectric material. In addition, thermoelectric materials including Bi—Te intermetallic compounds, when to be applied to waste heat at intermediate temperatures in practice, require sophisticated peripheral technologies for ensuring endurance, because they have low oxidation resistance and unsatisfactory mechanical strengths. For these reasons, the Bi—Te intermetallic compounds are hardly applicable to waste heat at intermediate temperatures.

As with the Bi—Te intermetallic compounds, the Pb—Te intermetallic compounds are undesirable to be used, because the constitutional element Pb is harmful and toxic to the human body and is not desirable also from the viewpoint of global environment.

Of the Zn—Sb intermetallic compounds, ZnSb acts as a p-type semiconductor, has a high Seebeck coefficient of 200 μV/K and a low electric resistance, and has been investigated as a thermoelectric semiconductor. However, materials of this type will invite higher production cost of thermoelectric conversion elements because they have low strengths and low toughness and are difficult to assemble practically into modules unless their mechanical properties are considerably improved.

The oxide thermoelectric materials advantageously have a high Seebeck coefficient at high temperatures of around 1000 K rather than at intermediate temperatures ranging from 500 K to 700 K. The oxide thermoelectric materials are, however, fragile and difficult to process, as with the Bi—Te thermoelectric materials. For this reason, the oxide thermoelectric materials, when used to produce thermoelectric conversion elements, invite higher production cost of the thermoelectric conversion elements, because the materials require a machining allowance (cutting stock) for cutting, the ingots of them are susceptible to crack upon cutting, and result in very low yields.

By contrast, the $Fe_2VAl$ thermoelectric materials described in PTLs 1 to 3 include elements of Fe, V, and Al, being relatively inexpensive and having no toxicity, and are thereby superior as thermoelectric materials to the Bi—Te intermetallic compounds and Pb—Te intermetallic compounds. The $Fe_2VAl$ thermoelectric materials employ an $Fe_2VAl$ basic structure being a metalloid (semi-metal) positioned between semiconductors and metals and thereby have higher toughness and better mechanical properties than those of semiconductors and oxides, as described in PTLs 1 to 3. For these reasons, the $Fe_2VAl$ thermoelectric materials described in PTLs 1 to 3 have better mechanical properties than those of the Zn—Sb intermetallic compounds and oxide thermoelectric materials.

However, of the $Fe_2VAl$ thermoelectric materials described in PTLs 1 to 3, those having a structure based on the $Fe_2VAl$ basic structure, except for substituting another element for part of a constitutional element, include constitutional elements in a number larger than that of $Fe_2VAl$ and thus invite higher material cost, which material cost may further increase depending on the type of the dopant element to be employed. In addition, upon recycling of thermoelectric materials having a structure based on the $Fe_2VAl$ basic structure, except for substituting another element for part of a constitutional element, it is difficult to remove the other element from the thermoelectric materials.

Accordingly, demands are made to allow compounds having a structure based on the $Fe_2VAl$ basic structure, except for controlling the compositional ratio of the three constitutional elements without substituting another dopant element for a constitutional element to exhibit satisfactory electric generation efficiency at intermediate temperatures ranging from 500 K to 700 K, which compounds are exemplified by the $(Fe_{2/3}V_{1/3})_{3-n}Al_{1+n}$ compound described in PTL 1.

The compound described in PTL 1 without substitution of another element exhibits satisfactory electric generation efficiency at temperatures lower than the intermediate temperatures ranging from 500 K to 700 K. To improve this, demands have been made to provide a thermoelectric material which has a controlled compositional ratio of the three constitutional elements and which exhibits satisfactory electric generation efficiency in a temperature range higher than that of the compound described in PTL 1 without substitution of another element.

The present invention has been made under these circumstances, and an object of the present invention is to provide a thermoelectric material which includes a compound having a structure based on an $Fe_2VAl$ basic structure, which has a controlled compositional ratio of the three elements without substitution of another element, and which exhibits satisfactory electric generation efficiency in a temperature range higher than that of the compound described in PTL 1 having a controlled compositional ratio of the three elements without substitution of another element.

Another object of the present invention is to provide a thermoelectric material which includes a compound having a structure based on an $Fe_2VAl$ basic structure, which has a controlled compositional ratio of the three elements without substitution of another element, and which exhibits better electric generation efficiency at intermediate temperatures ranging from 500 K to 700 K than that of a compound substituting another element for part of a constitutional element. Another object of the present invention is to provide a method for generating electricity by using such a thermoelectric material at an intermediate temperature in a range from 500K to 700K.

Solution to Problem

As is verified by the present inventors in the earlier application (PTL 1), the $Fe_2VAl$ basic structure having a Heusler alloy type crystal structure has a total number of valence electrons of 24 per chemical formula. Specifically, when an average electron concentration per atom is 24/4=6, the thermoelectric material has a sharp pseudogap at the Fermi level. The Fermi level can be shifted from the center of the pseudogap, and the Seebeck coefficient can be changed in sign (plus or minus) and/or magnitude by regulating the chemical compositional ratios among Fe, V and Al with respect to the basic structure so as to control the total number of valence electrons per chemical formula.

The present inventors have found a compound having a structure based on the $Fe_2VAl$ basic structure and having controlled compositional ratios of only two elements V and Al without regulation of the compositional ratio of Fe; and found that this compound can have a Seebeck coefficient whose absolute value reaches a peak at a temperature higher than that of a corresponding compound having controlled compositional ratios of all the three elements, Fe, V, and Al as in the compound described in PTL 1. The present invention has been made based on these findings.

Specifically, a first aspect of the present invention provides a method for generating electricity by using a thermoelectric material having a Heusler alloy type crystal structure and having a structure expressed by General Formula $Fe_2V_{1-z}Al_{1+z}$, the structure based on an $Fe_2VAl$ basic structure having a total number of valence electrons of 24 per chemical formula, in which z satisfies a condition expressed by $0.03 \leq z \leq 0.12$; the thermoelectric material is controlled to have a total number of valence electrons of 23.76 or more and less than 24 per chemical formula and to act as a p-type material; and the thermoelectric material has a Seebeck coefficient whose absolute value reaches a peak at a temperature of 400 K or higher, and electricity is generated by using the thermoelectric material at a temperature in a range from 500K to 700K.

A second aspect of the present invention provides a method for generating electricity by using a thermoelectric material having a Heusler alloy type crystal structure and being based on an $Fe_2VAl$ basic structure having a total number of valence electrons of 24 per chemical formula, in which the thermoelectric material has a chemical compositional ratio controlled so as to have a structure expressed by General Formula $Fe_2V_{1-z}Al_{1+z}$, where z satisfies a condition expressed by $0.03 \leq z \leq 0.12$ and electricity is generated by using the thermoelectric material at a temperature in a range from 500K to 700K.

The thermoelectric materials of the first and second aspects are controlled to act as a p-type material so as to have a total number of valence electrons per chemical formula of 23.76 or more and less than 24 and to have a Seebeck coefficient whose absolute value reaches a peak at a temperature of 400 K or higher. The thermoelectric materials therefore have peaks of an absolute value of Seebeck coefficient equivalent to or higher than, and have Seebeck coefficients whose absolute values reach a peak at temperatures higher than, those of the compound described in PTL 1 which is controlled to act as a p-type material without substitution of another element. This will be demonstrated by a comparison between Example 1 and Comparative Example 3 mentioned later (see FIGS. 1 and 3).

The thermoelectric materials of the first and second aspects therefore exhibit satisfactory electric generation efficiency in temperature ranges higher than that of the compound described in PTL 1 which is controlled to act as a p-type material without substitution of another element.

According to a third aspect of the present invention, the parameter z is more preferably 0.05 or more and 0.12 or less ($0.05 \leq z \leq 0.12$). The thermoelectric materials, when specifying z to be 0.05 or more and 0.12 or less, can have better electric generation efficiency at intermediate temperatures ranging from 500 K to 700 K than that of the compound substituting another element for part of a constitutional element. This will be demonstrated by a comparison between Example 1 and Comparative Example 2 (see FIG. 8).

A fourth aspect of the present invention provides a thermoelectric material having a Heusler alloy type crystal structure and having a structure expressed by General Formula $Fe_2V_{1-z}Al_{1+z}$, the structure based on an $Fe_2VAl$ basic structure having a total number of valence electrons of 24 per chemical formula, in which z satisfies a condition expressed by $-0.12 \leq z \leq -0.03$; the thermoelectric material is controlled to have a total number of valence electrons of more than 24 and less than or equal to 24.24 per chemical formula and to act as an n-type material; and the thermoelectric material has a Seebeck coefficient whose absolute value reaches a peak at a temperature of 310 K or higher.

A fifth aspect of the present invention provides a thermoelectric material having a Heusler alloy type crystal structure and being based on an $Fe_2VAl$ basic structure having a total number of valence electrons of 24 per chemical formula, in which the thermoelectric material has a chemical compositional ratio controlled so as to have a structure expressed by General Formula $Fe_2V_{1-z}Al_{1+z}$, where z satisfies a condition expressed by $-0.12 \leq z \leq -0.03$.

The thermoelectric materials of the fourth and fifth aspects are controlled to act as n-type materials so as to have a total number of valence electrons per chemical formula of more than 24 and less than or equal to 24.24 and have Seebeck coefficients whose absolute values reach a peak at temperatures 310 K or higher. The thermoelectric materials therefore have peaks of an absolute value of Seebeck coefficient equivalent to or higher than, and have Seebeck coefficients whose absolute value reaches a peak of higher than, those of the compound described in PTL 1 which is controlled to act as a n-type material without substitution of another element. This will be demonstrated by a comparison between Example 2 and Comparative Example 4 (see FIGS. 3 and 5).

The thermoelectric materials according to the fourth and fifth aspects therefore exhibit satisfactory electric generation efficiency in a temperature range higher than that of the compound described in PTL 1 which is controlled to act as a n-type material without substitution of another element.

According to a sixth aspect of the present invention, parameter z is more preferably −0.12 or more and −0.05 or less ($-0.12 \leq z \leq -0.05$). The thermoelectric materials, when specifying z to be −0.12 or more and −0.05 or less, can have better electric generation efficiency at intermediate temperatures ranging from 500 K to 700 K than that of the compound substituting another compound for part of a constitutional element (see FIG. 9).

A seventh aspect of the present invention provides a thermoelectric material having a Heusler alloy type crystal structure and having a structure expressed by General Formula $Fe_2V_{1-z}Al_{1+z}$, the structure based on an $Fe_2VAl$ basic structure having a total number of valence electrons of 24 per chemical formula, wherein z satisfies a condition expressed by $0.05 \leq z \leq 0.12$; wherein the thermoelectric material is controlled to have a total number of valence electrons of 23.76 or more and less than 24 per chemical formula and to act as a p-type material; wherein the thermoelectric material has a Seebeck coefficient whose absolute value reaches a peak at a temperature of 490 K or higher: and the Seebeck. coefficient becomes 70 μV/K or more when its absolute value reaches the peak. The thermoelectric materials, when specifying z to be 0.05 or more and 0.12 or less, can have better electric generation efficiency at intermediate temperatures ranging from 500 K to 700 K than that of the compound substituting another element for part of a constitutional element. This will be demonstrated by a comparison between Example 1 and Comparative Example 2 (see FIG. 8).

DESCRIPTION OF EMBODIMENTS

Thermoelectric materials according to embodiments of the present invention may be manufactured typically by the following manufacturing method. The manufacturing method includes a first step of preparing a material mixture containing such elements in such compositional ratios as to give any of the thermoelectric materials; and a second step of melting or vaporizing the material mixture in a vacuum or in an inert gas and solidifying the molten or vaporized material mixture to give the thermoelectric material.

The thermoelectric materials, when manufactured by the manufacturing method, have relatively high power factors even at intermediate temperatures ranging from 500 K to 700 K. The manufacturing method therefore enables inexpensive manufacturing of thermoelectric materials which can highly efficiently recover waste heat (exhaust heat) and may less cause environmental pollution.

The second step may employ, for example, a process of melting the material mixture in a vacuum or in an inert gas, and cooling the molten material mixture. To give an n-type thermoelectric material or p-type thermoelectric material as a bulk material of powder particles having minimized grain sizes, the second step may employ a process of melting the material mixture typically through arc melting, solidifying the molten material mixture to give an ingot, and mechanically pulverizing the ingot in an inert gas or nitrogen gas atmosphere to give powder particles having almost uniformized grain sizes; a process of subjecting the material mixture to molten metal atomization or gas atomization to give powder particles having almost uniformized grain sizes; or a process of subjecting the material mixture to repeating compression bonding and breakage through mechanical alloying in an inert gas or nitrogen gas atmosphere to thereby give powder particles having almost uniformized grain sizes. The resulting powder particles can be sintered typically by vacuum hot pressing, hot isostatic pressing (HIP), spark plasma sintering, or pulse electric current sintering. Sintering of the powder, when employing HIP, may be performed by allowing compaction and sintering to proceed simultaneously typically at a temperature of 800° C. in an atmosphere of argon gas at a high pressure of 150 MPa so as to achieve fully dense consolidation. The sintering may also employ pseudo-HIP (pseudo hot isostatic pressing) to preform full dense consolidation inexpensively using a forming press. To give an n-type thermoelectric material or p-type thermoelectric material as a bulk material of crystal grains having minimized grain sizes, the method may employ a process of reducing sizes of crystal grains by plastic deformation such as hot rolling, or by quenching the molten material.

The thermoelectric materials according to the present invention can give thermoelectric conversion elements. In the resulting thermoelectric conversion elements, the thermoelectric material having a positive Seebeck coefficient behaves as a p-type material, and the thermoelectric material having a negative Seebeck coefficient behaves as an n-type material. These thermoelectric conversion elements have high thermoelectric conversion efficiency, can be manufactured at lower cost, and may less cause environmental pollution.

EXAMPLES

Examples 1 and 2

Thermoelectric materials of Examples 1 and 2 have structures based on the $Fe_2VAl$ basic structure and expressed by General Formula $Fe_2V_{1-z}Al_{1+z}$, in which the control parameter z is selected within the range of more than −0.2 and less than 0.2.

The $Fe_2VAl$ basic structure has a total number of valence electrons of 24 per chemical formula, as calculated below. Specifically, an iron (Fe) atom has eight valence electrons including two in the 4s orbital and six in the 3d orbital, and the basic structure includes two iron atoms per chemical formula, namely, has sixteen valence electrons in total, as calculated by multiplying eight by two. A vanadium (V) atom has five valence electrons in total, including two in the 4s orbital and three in the 3d orbital. An aluminum (Al) atom has three valence electrons in total, including two in the 3s orbital and one in the 3p orbital. A total number, 24, of the valence electrons of iron, vanadium, and aluminum is the total number of valence electrons of the basic structure per chemical formula.

Compounds based on the basic structure and having structures expressed by General Formula $Fe_2V_{1-z}Al_{1+z}$, when controlled to have the parameter z of more than 0 and less than 0.2, have a total number of valence electrons of less than 24 and act as p-type thermoelectric materials. The compounds, when controlled to have the parameter z of −0.2 or more and less than 0, have a total number of valence electrons of more than 24 and act as n-type thermoelectric materials.

Specifically, the control parameter z for General Formula $Fe_2V_{1-z}Al_{1+z}$ is from 0.03 to 0.12 in Example 1; and is from −0.03 to −0.12 in Example 2. The total number of valence electrons per chemical formula is from 23.76 to 23.94 in Example 1 because of having z of 0.03 to 0.12; and is 24.24.06 to 24.24 in Example 2 because of having z of −0.03 to −0.12.

Each of the thermoelectric materials was manufactured in the following manner. Initially, the three elements Fe, V, and Al were weighed so as to satisfy the conditions. The elements were melted using argon arc to give button-shaped ingots. For obtaining homogeneous ingots, the ingots were further subjected to remelting two or more times and thereby yielded homogeneous ingots. It was assumed that a compositional change by melting is trivial, because a weight change between before and after melting was 0.1% or less.

The above-prepared ingots were subjected to homogenization (soaking) at 1273 K in a high vacuum of $5 \times 10^{-3}$ Pa or less for 48 hours and shaped into strips, powders, and blocks as measurement specimens. The specimens were subjected to stress relief treatment at 1273 K for one hour and ordering at 673 K for 4 hours and thereby yielded thermoelectric materials of Examples 1 and 2.

The thermoelectric materials of Examples 1 and 2 had total numbers of valence electrons significantly shifted from that (24) of the basic structure by controlling the compositional ratio between V and Al only slightly.

The smaller the control parameter for the compositional ratio deviated from the stoichiometric composition is, the more satisfactorily the compound remains as a solute (solid solution). In contrast, precipitates may be formed with a compositional ratio control parameter largely deviated from the stoichiometric composition, and thereby not all of the constitutional elements are present as solutes.

Accordingly, the thermoelectric materials of Examples 1 and 2 maintained the basic structure because of having small control parameters.

Comparative Example 1

Thermoelectric materials of Comparative Example 1 were prepared by substituting Ti for part of V in the $Fe_2VAl$ basic structure so as to have structures expressed by $Fe_2(V_{1-\alpha}Ti_\alpha)Al$, where $\alpha$ is 0.03, 0.05, or 0.10. Other conditions are as in Examples 1 and 2.

Comparative Example 2

Thermoelectric materials of Comparative Example 2 were prepared by substituting Si for part of Al in the $Fe_2VAl$ basic structure so as to have structures expressed by $Fe_2V(Al_{1-\beta}Si_\beta)$, where $\beta$ is 0.036, 0.05, 0.10, or 0.20. Other conditions are as in Examples 1 and 2.

Comparative Examples 3 and 4

Thermoelectric materials of Comparative Examples 3 and 4 were prepared as the compounds described in PTL 1 and expressed by $(Fe_{2.3}V_{1/3})_{3-n}Al_{1+n}$, in which the compositional ratios of the three elements were controlled without substitution of another element. The parameter n is 0.012 or 0.02 in Comparative Example 3; and is −0.008, −0.016, or −0.008 in Comparative Example 4. Other conditions are as in Examples 1 and 2.

[Evaluation Methods]

The thermoelectric materials of Examples 1 and 2 and Comparative Examples 1 to 4 were examined by the following evaluations.

(X-Ray Diffractometry)

The above-prepared powders were subjected to X-ray diffractometry to determine a structure of each material. The evaluation was performed with Cu Kα radiation. A monochromator was used to remove the background, because the materials to be evaluated are Fe-containing alloys. As a result of X-ray diffractometry, all the above-prepared materials were found to have Heusler structures.

(Measurement of Seebeck Coefficient)

A Seebeck coefficient S (μV/K) of each material was measured using a specimen having a size of 0.5 by 0.5 by 5.0 mm³ with the device "SB-100" supplied by MMR-Technologies, Inc. at temperatures of 100 K to 700 K. Measurements of the specimens of Comparative Example 1 were performed at temperatures of 100 K to 600 K (see FIG. 4), and measurements of the specimens of Comparative Examples 2, 3, and 4 were performed at temperatures of 100 K to 400 K (see FIGS. 3 and 7).

(Measurement of Electrical Resistivity)

An electrical resistivity ρ (μΩm) of each strip specimen having a size of 1 by 1.2 by 15 mm³ was measured by a direct-current four probe method. The measurement was performed at temperatures of from liquid helium temperature (4.2 K) to 1273 K. The measurement was performed through spontaneous temperature rise at temperatures from 4.2 K to room temperature; and was performed by heating the specimen in an electric furnace at a rate of temperature rise of 0.05 K/second in a vacuum atmosphere of $5\times10^{-3}$ Pa or less at temperatures from room temperature to 1273 K.

(Power Factor)

A power factor $P=S^2/\rho$ was employed as an index for evaluation of thermoelectric materials, in which S represents the Seebeck coefficient; and ρ represents the electrical resistivity. The above-measured Seebeck coefficient and electrical resistivity were substituted into the expression to determine the power factor P ($10^{-3}$ W/mK²).

Figure 1:
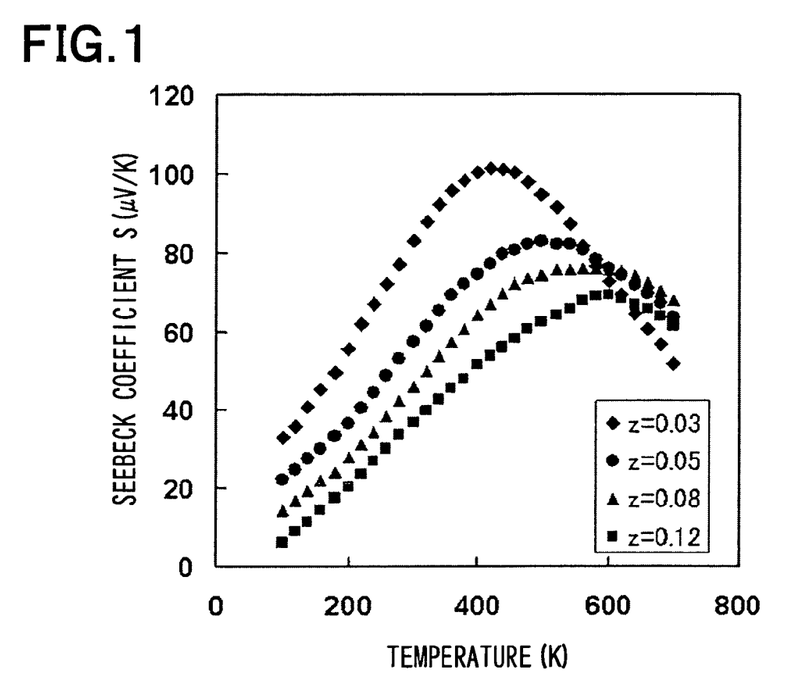
FIG. 1 is a graph illustrating how the Seebeck coefficient varies depending on the temperature, in thermoelectric materials of Example 1 ($Fe_2V_{1-z}Al_{1+z}$, where z is 0.03, 0.05, 0.08, or 0.12).
Figure 2:
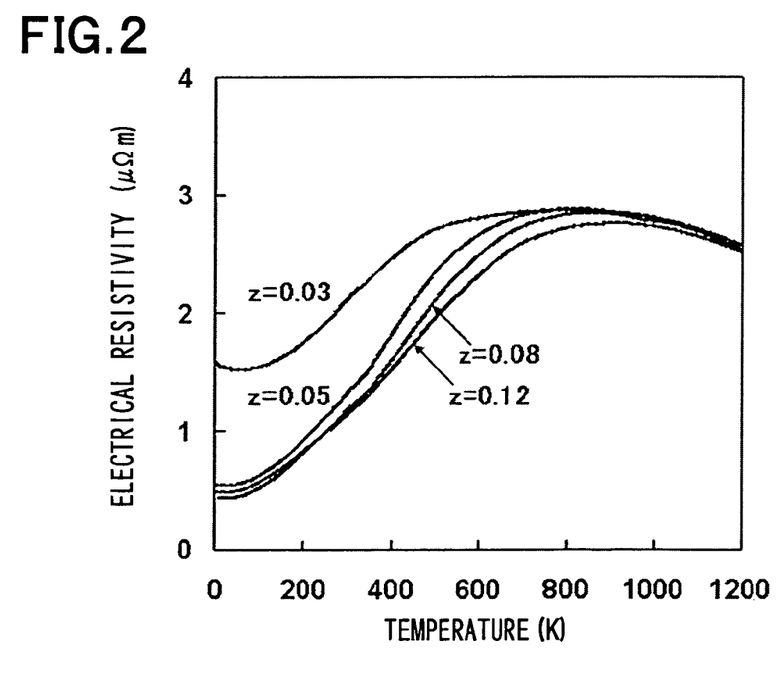
FIG. 2 is a graph illustrating how the electrical resistivity varies depending on the temperature, in the thermoelectric materials of Example 1 ($Fe_2V_{1-z}Al_{1+z}$, where z is 0.03, 0.05, 0.08, or 0.12).
Figure 3:
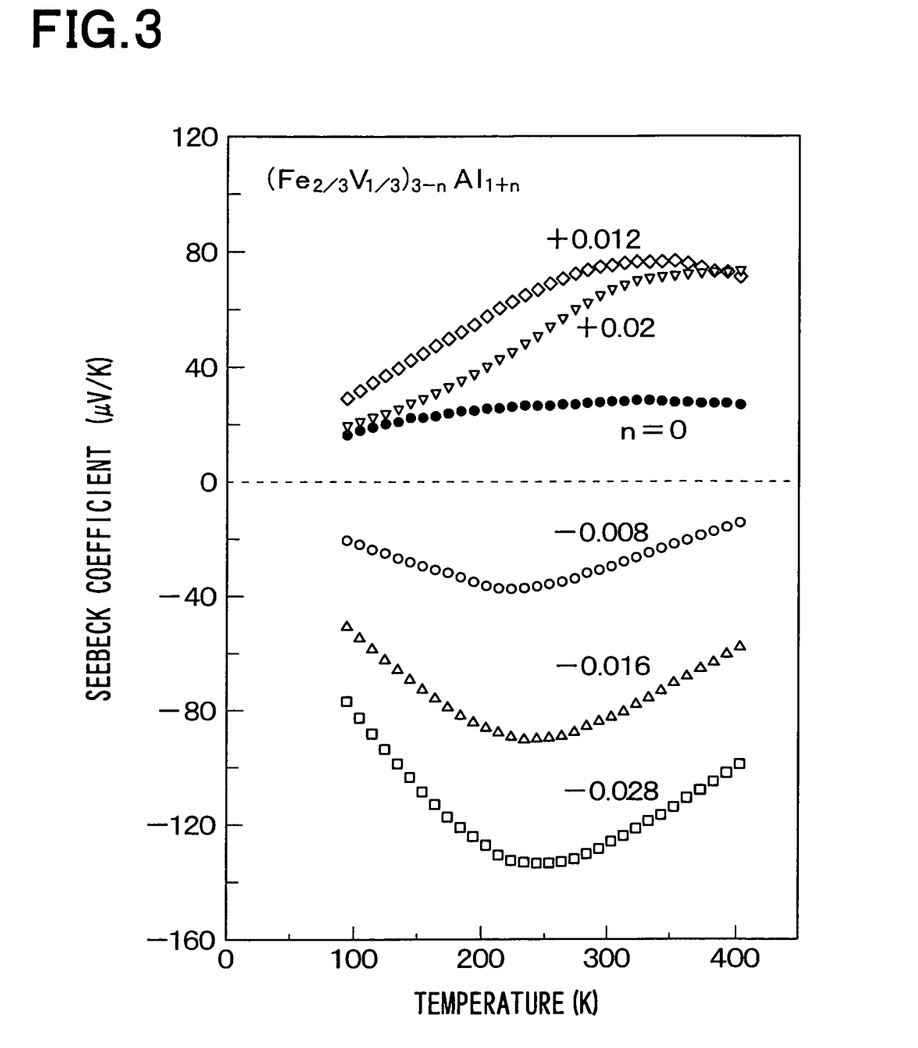
FIG. 3 is a graph illustrating how the Seebeck coefficient varies depending on the temperature, in thermoelectric materials of Comparative Examples 3 and 4 (($Fe_{2/3}V_{1/3})_{3-n}Al_{1+n}$, where n is 0.012, 0.02, −0.008, −0.016, or −0.028).

FIG. 1 illustrates how the Seebeck coefficient varies depending on the temperature; and FIG. 2 illustrates how the electrical resistivity varies depending on the temperature, each in the thermoelectric materials of Example 1 ($Fe_2V_{1-z}Al_{1+z}$, where z is 0.03, 0.05, 0.08, or 0.12). FIG. 3 depicts how the Seebeck coefficient varies depending on the temperature, in the thermoelectric materials of Comparative Example 3 (($Fe_{2/3}V_{1/3})_{3-n}Al_{1+n}$, where n is 0.012 or 0.02).

FIG. 1 demonstrates that the thermoelectric materials of Example 1, as having z of more than 0 and less than 0.2, had total numbers of valence electrons of less than 24, had positive Seebeck coefficients, and acted as p-type materials. The Seebeck coefficient reached a peak of about 102 μV/K at 400 K in a composition having z of 0.03. FIG. 1 also demonstrates that the temperature (peak temperature) at which an absolute value of Seebeck coefficient reaches a peak shifted to a higher temperature, with an increasing parameter z, namely, with an increasing Al content. Specifically, the peak temperature reached 600 K in a composition having z of 0.12. The Seebeck coefficient was about 70 μV/K at 600 K in the composition having z of 0.12.

By contrast, FIG. 3 demonstrates that the thermoelectric materials of Comparative Example 3 also had positive Seebeck coefficients, acted as p-type materials, but had Seebeck coefficients peaking at about 70 μV/K, and absolute values of which reached a peak at temperatures of around 400 K.

A comparison between data in FIG. 1 and FIG. 3 demonstrates that the thermoelectric materials of Example 1 had peaks of absolute values of Seebeck coefficients equivalent to or more than, and had Seebeck coefficients whose absolute values reach a peak at temperatures higher than, those of the thermoelectric materials of Comparative Example 3.

In addition, FIG. 1 indicates that the thermoelectric materials of Example 1 had absolute values of Seebeck coefficient of 50 μV/K or more at intermediate temperatures ranging from 500 K to 700 K, which absolute values are speculatively higher than those of the thermoelectric materials of Comparative Example 3 as speculated from FIG. 3.

FIG. 2 demonstrate that the thermoelectric materials of this example (Example 1) experienced abrupt reduction in electrical resistivity at temperatures of 800 K or lower with an increasing parameter z, namely, with an increasing Al content. Specifically, FIG. 2 demonstrates that thermoelectric materials having z of 0.05 to 0.12 had electrical resistivities lower than that of the thermoelectric material having z of 0.03 at intermediate temperatures ranging from 500 K to 700 K.

Figure 4:
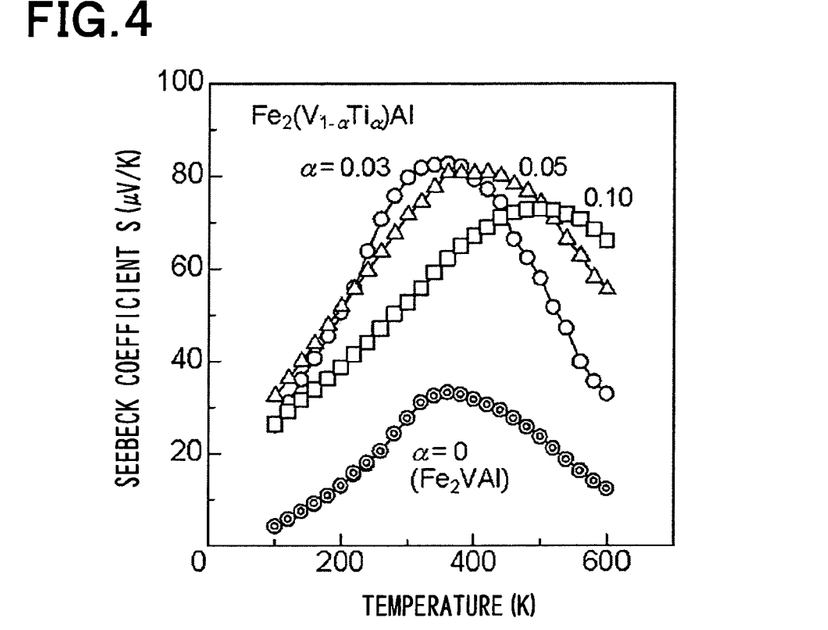
FIG. 4 is a graph illustrating how the Seebeck coefficient varies depending on the temperature, in thermoelectric materials of Comparative Example 1 ($Fe_2(V_{1-\alpha}Ti_\alpha)Al$, where α is 0.03, 0.05, or 0.10).

FIG. 4 depicts how the Seebeck coefficient varies depending on the temperature, in the thermoelectric materials of Comparative Example 1 ($Fe_2(V_{1-\alpha}Ti_\alpha)Al$, where $\alpha$ is 0.03, 0.05, or 0.10).

FIG. 4 demonstrates that the thermoelectric materials of Comparative Example 1 also had positive Seebeck coefficients and acted as p-type materials, but had Seebeck coefficients at 600 K of about 30 μV/K in a composition having a parameter α of 0.03, and of about 70 μV/K in a composition having a parameter α of 0.10; and that the thermoelectric materials had absolute values of Seebeck coefficient at 600 K of equivalent to or less than those of the thermoelectric materials of Example 1. FIG. 4 also demonstrates that the temperature at which an absolute value of the Seebeck coefficient reaches a peak was 490 K at a maximum in the composition having a parameter α of 0.10.

By contrast, FIG. 1 demonstrates that the thermoelectric materials of Example 1 had Seebeck coefficients whose absolute values reach a peak at temperatures of higher than 490 K when z is 0.05 to 0.12.

Figure 5:
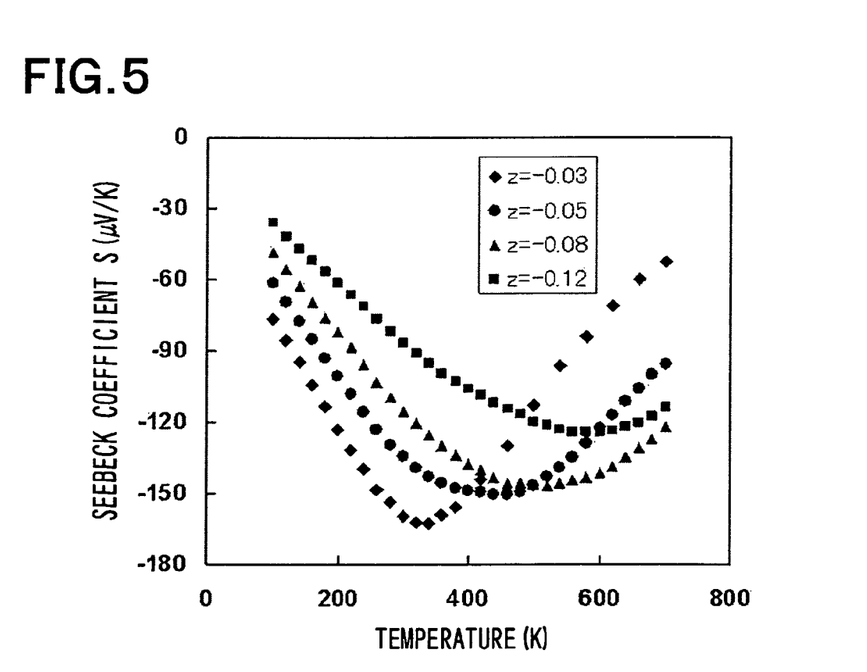
FIG. 5 is a graph illustrating how the Seebeck coefficient varies depending on the temperature, in thermoelectric materials of Example 2 ($Fe_2V_{1-z}Al_{1+z}$, where z is −0.03, −0.05, −0.08, or −0.12).
Figure 6:
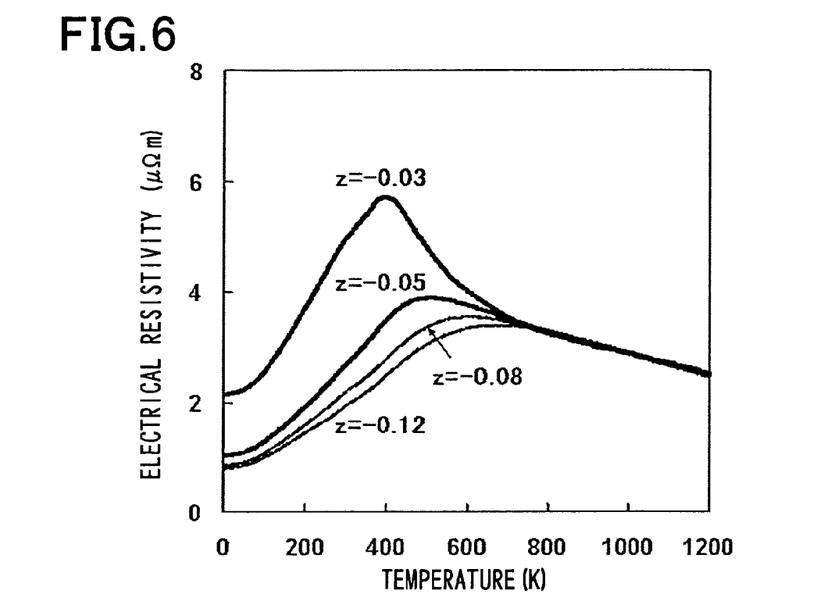
FIG. 6 is a graph illustrating how the electrical resistivity varies depending on the temperature, in the thermoelectric materials of Example 2 ($Fe_2V_{1-z}Al_{1+z}$, where z is −0.03, −0.05, −0.08, or −0.12).

FIG. 5 depicts how the Seebeck coefficient varies depending on the temperature, and FIG. 6 depicts how the electrical resistivity varies depending on the temperature, each in the thermoelectric materials of Example 2 ($Fe_2V_{1-z}Al_{1+z}$, where z is −0.03, −0.05, −0.08, or −0.12). FIG. 3 depicts how the Seebeck coefficient varies depending on the temperature, in the thermoelectric materials of Comparative Example 4 (($Fe_{2/3}V_{1/3})_{3-n}Al_{1+n}$, where n is −0.028, −0.016, or −0.008).

FIG. 5 demonstrates that the thermoelectric materials of Example 2, as having z of more than −0.2 and less than 0, had total numbers of valence electrons of more than 24, had negative Seebeck coefficients, and acted as n-type materials; and that an absolute value of Seebeck coefficient peaked at about −161 μV/K at 310 K in a composition having z of −0.03. FIG. 5 also demonstrates that, with a decreasing z, namely, with an increasing V content, the temperature at which an absolute value of Seebeck coefficient reaches a peak shifted to a higher temperature; and that the peak temperature reached 580 K in a composition having z of −0.12. The Seebeck coefficient was about −120 μV/K at 580 K in the composition having z of −0.12.

By contrast, FIG. 3 demonstrates that the thermoelectric materials of Comparative Example 4 also had negative Seebeck coefficients and acted as n-type materials, but absolute values of Seebeck coefficients peaked at about −40 to about −130 μV/K at temperatures of around 250 K.

A comparison in data between FIG. 5 and FIG. 3 demonstrates that the thermoelectric materials of Example 2 had peaks of absolute values of Seebeck coefficients of equivalent to or higher than, and had Seebeck coefficients whose absolute values reach a peak at temperatures higher than, those of the thermoelectric materials of Comparative Example 4.

FIG. 5 speculatively demonstrates that the thermoelectric materials of Example 2 had absolute values of Seebeck coefficient of 50 μV/K or more at intermediate temperatures ranging from 500 K to 700 K; had absolute values of 90 μV/K or more in compositions where z is −0.12 or more and −0.05 or less; and had absolute values of 100 μV/K or more in compositions where z is −0.12 or more and −0.08 or less; and speculatively had absolute values of Seebeck coefficient higher than those of the thermoelectric materials of Comparative Example 4 as speculated from FIG. 3.

FIG. 6 demonstrates that the thermoelectric materials of Example 2 experienced reduction in electrical resistivity at temperatures of 700 K or lower, with a decreasing z, namely, with an increasing V content.

Figure 7:
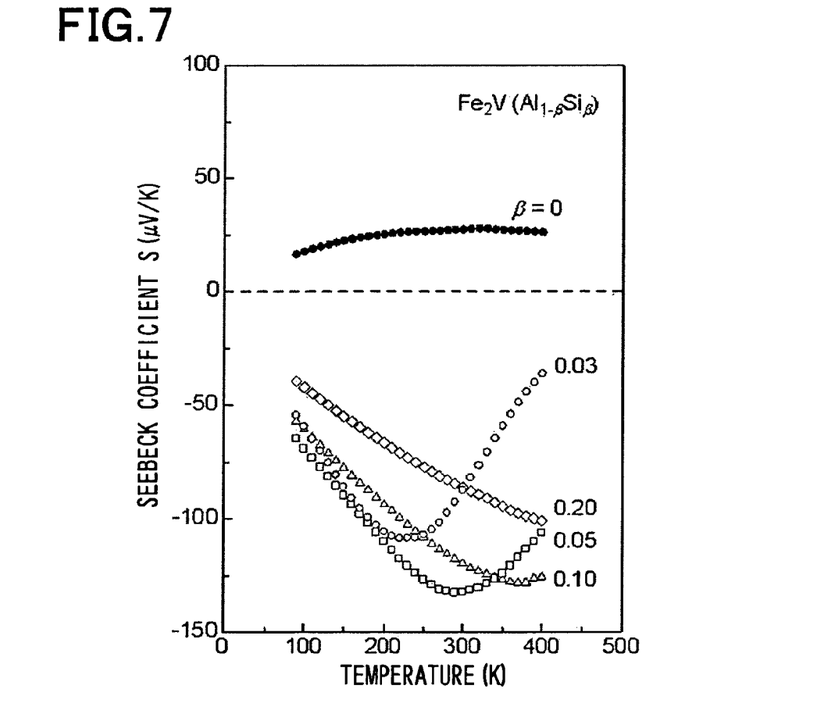
FIG. 7 is a graph illustrating how the Seebeck coefficient varies depending on the temperature, in thermoelectric materials of Comparative Example 2 ($Fe_2V(Al_{1-\beta}Si_\beta)$, where β is 0.03, 0.05, 0.10, or 0.20).

FIG. 7 depicts how the Seebeck coefficient varies depending on the temperature, in the thermoelectric materials of Comparative Example 2 ($Fe_2V(Al_{1-\beta}Si_\beta)$, where β is 0.036, 0.05, 0.10, or 0.20).

FIG. 7 demonstrates that the thermoelectric materials of Comparative Example 2 also had negative Seebeck coefficients and acted as n-type materials, but had a Seebeck coefficient whose absolute value reaches a peak at a temperature of at highest 400 K in a composition where β is 0.20. To allow the thermoelectric materials of Comparative Example 2 to have a Seebeck coefficient whose absolute value reaches a peak at a temperature of 400 K or higher, the substitution amount β may further be increased. However, significant substitution of another element for part of a constitutional element may cause formation of precipitates, and for this reason, it is difficult to control the peak temperature to be 400 K or higher while suppressing the formation of such precipitates.

By contrast, FIG. 5 demonstrates that the thermoelectric materials of Example 2, when having z of −0.05 to −0.12, had Seebeck coefficients whose absolute values reach a peak at temperatures higher than 400 K.

Figure 8:
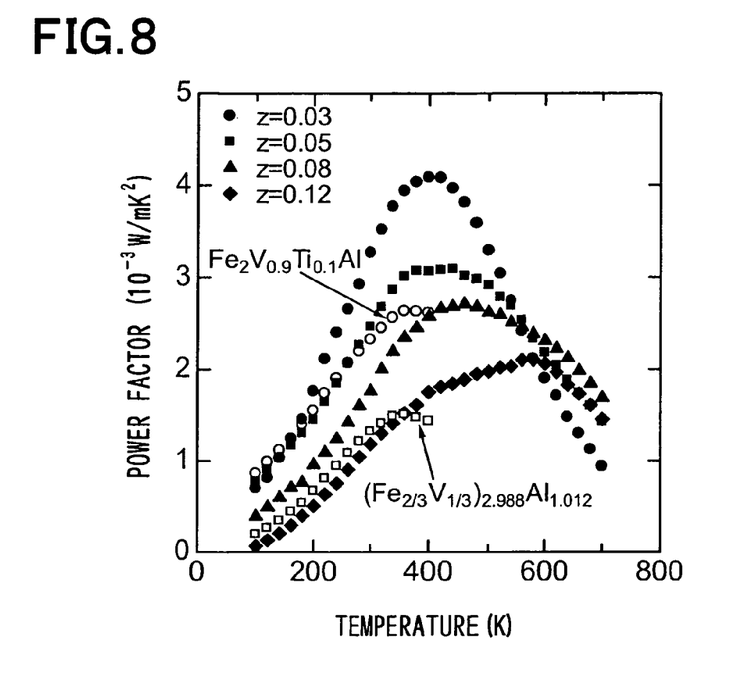
FIG. 8 is a graph illustrating how the power factor varies depending on the temperature, in the thermoelectric materials of Example 1 ($Fe_2V_{1-z}Al_{1+z}$, where z is 0.03, 0.05, 0.08, or 0.12).

How the power factor varies depending on the temperature was determined on the thermoelectric materials of Example 1 ($Fe_2V_{1-z}Al_{1+z}$, where z is 0.03, 0.05, 0.08, or 0.12), the results of which are indicated in FIG. 8. FIG. 8 also indicates the results of, of the thermoelectric materials of Comparative Examples 1 and 3, those having high peak temperatures.

FIG. 8 demonstrates that, of the p-type thermoelectric materials of Example 1, one having z of 0.03 had a power factor reaching $4.2 \times 10^{-3}$ W/mK$^2$ at 400 K, which is larger than a representative power factor $3.0 \times 10^{-3}$ W/mK$^2$ of the Bi—Te p-type thermoelectric material, customary representative thermoelectric material.

FIG. 8 also demonstrates that, with an increasing Al content, the power factor decreased, but the peak temperature thereof shifted to a higher temperature; and that the peak temperature reached 580 K in a composition having z of 0.12.

In addition, FIG. 8 demonstrates that the thermoelectric materials of Example 1 had power factors at intermediate temperatures ranging from 500 K to 700 K of $0.9 \times 10^{-3}$ W/mK$^2$ or more in a composition having z of 0.03 and of $1.4 \times 10^{-3}$ W/mK$^2$ or more in compositions having z of 0.05 to 0.12; and indicates that the thermoelectric material of Example 1 speculatively have power factors in this temperature range higher than those of the thermoelectric material of Comparative Example 3, ($Fe_{2/3}V_{1/3})_{2.988}Al_{1.012}$, and of the $Fe_2V_{0.9}Ti_{0.1}Al$ thermoelectric material of Comparative Example 1, in which the power factors of the latter two thermoelectric materials were derived from virtual extension lines extending from the data in FIG. 8 to the temperature range of 500 K to 700 K.

Figure 9:
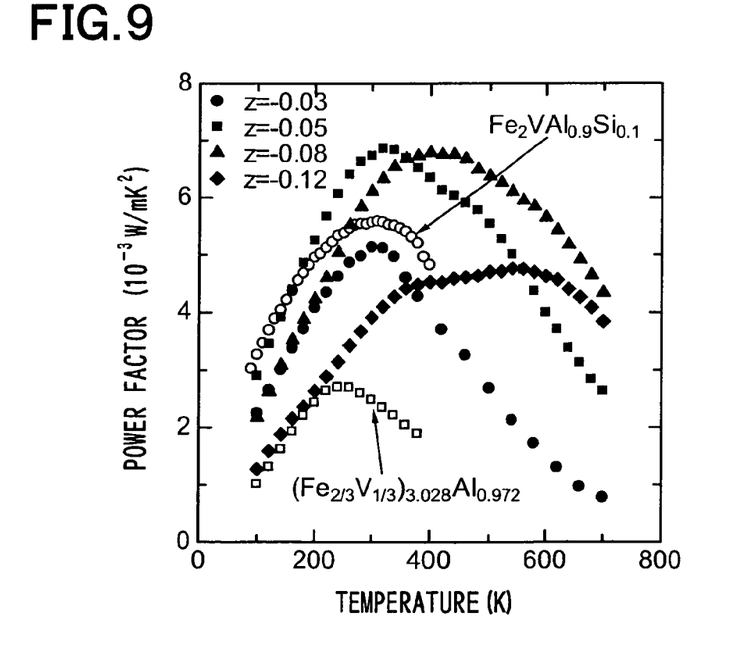
FIG. 9 is a graph illustrating how the power factor varies depending on the temperature, in the thermoelectric materials of Example 2 ($Fe_2V_{1-z}Al_{1+z}$, where z is −0.03, −0.05, −0.08, or −0.12).

How the power factor varies depending on the temperature was determined on the thermoelectric materials of Example 2 ($Fe_2V_{1-z}Al_{1+z}$, where z is −0.03, −0.05, −0.08, or −0.12), the results of which are indicated in FIG. 9. FIG. 9 also indicates the results of, of the thermoelectric materials of Comparative Examples 2 and 4, those having high peak temperatures.

As with above, FIG. 9 demonstrates that, of the n-type thermoelectric materials of Example 2, one having z of −0.05 had a power factor reaching $6.8 \times 10^{-3}$ W/mK$^2$ at 310 K, which is much larger than the representative power factors of $4.0 \times 10^{-3}$ W/mK$^2$ to $5.0 \times 10^{-3}$ W/mK$^2$ of the customary representative thermoelectric material, namely, the Bi—Te n-type thermoelectric material.

FIG. 9 also demonstrates that a temperature at which the power factor reaches a peak shifted to a higher temperature with an increasing V content; and reached 550 K in a composition having z of −0.12.

In addition, FIG. 9 demonstrates that the thermoelectric materials of Example 2 had power factors at intermediate temperatures ranging from 500 K to 700 K of $0.5 \times 10^{-3}$ W/mK$^2$ or more in compositions having z of −0.03 to −0.12; and indicates that the thermoelectric materials speculatively have power factors higher than those of the $(Fe_{2/3}V_{1/3})_{3.028}Al_{0.972}$ thermoelectric material of Comparative Example 4, where the power factors of the latter thermoelectric material were derived from a virtual extension line extending from the data in FIG. 9 to the temperature range of 500 K to 700 K.

FIG. 9 further demonstrates that the thermoelectric materials of Example 2 had power factors at intermediate temperatures ranging from 500 K to 700 K of $2.5 \times 10^{-3}$ W/mK$^2$ or more in compositions having z of −0.05 to −0.12; and indicates that the thermoelectric materials speculatively have power factors higher than those of the $Fe_2VAl_{0.9}Si_{0.1}$ thermoelectric material of Comparative Example 2, where the power factors of the latter thermoelectric material were derived from a virtual extension line extending from the data in FIG. 9 to the temperature range of 500 K to 700 K.

In addition, the thermoelectric materials of Examples 1 and 2 included a combination of Fe, V, and Al alone, which are inexpensive and nontoxic elements.

It can therefore be said that the thermoelectric materials of Examples 1 and 2 exhibit satisfactory electric generation efficiency in temperature ranges higher than those of the thermoelectric materials of Comparative Examples 3 and 4, respectively.

The thermoelectric materials of Example 1, particularly those having z of 0.05 to 0.12, can exhibit better electric generation efficiency than that of the thermoelectric material of Comparative Example 1 even at intermediate temperatures ranging from 500 K to 700 K.

Of the thermoelectric materials of Example 2, those having z of −0.05 to −0.12 can exhibit better electric generation efficiency than that of the thermoelectric materials of Comparative Example 2 even at intermediate temperatures ranging from 500 K to 700 K.

INDUSTRIAL APPLICABILITY

The present invention is applicable typically to power generators using waste heat at intermediate temperatures, such as in engines for automobiles and motorcycles, household fuel cells, and gas cogeneration systems.

The invention claimed is:

1. A method for generating electricity by using a thermoelectric material having a Heusler alloy type crystal structure and having a structure expressed by General Formula $Fe_2V_{1-z}Al_{1+z}$, the structure based on an $Fe_2VAl$ basic structure having a total number of valence electrons of 24 per chemical formula,
    wherein z satisfies a condition expressed by $0.03 \le z \le 0.12$; wherein the thermoelectric material is controlled to have a total number of valence electrons of 23.76 or more and less than 24 per chemical formula and to act as a p-type material; and wherein the thermoelectric material has a Seebeck coefficient whose absolute value reaches a peak at a temperature of 400 K or higher, and the Seebeck coefficient has an absolute value of about 50 µV/K or more at temperatures from 500 K to 700 K, and
    electricity is generated by using the thermoelectric material at a temperature in a range from 500K to 700K.

2. A method for generating electricity by using a thermoelectric material having a Heusler alloy type crystal structure and being based on an $Fe_2VAl$ basic structure having a total number of valence electrons of 24 per chemical formula, wherein the thermoelectric material has a chemical compositional ratio controlled so as to have a structure expressed by General Formula $Fe_2V_{1-z}Al_{1+z}$, where z satisfies a condition expressed by $0.03 < z < 0.12$, and wherein the thermoelectric, material has a Seebeck coefficient whose absolute value reaches a peak at a temperature of 400 K or higher, and the Seebeck coefficient has an absolute value of about 50 µV/K or more temperatures from 500 K to 700 K, and electricity is generated by using the thermoelectric material at a temperature in a range from 500K to 700K.

3. The method for generating electricity by using the thermoelectric material according to claim 1 at a temperature in a range from 500K to 700K, wherein z is 0.05 or more.

4. The method for generating electricity by using the thermoelectric material according to claim 2 at a temperature in a range from 500K to 700K, wherein z is 0.05 or more.

5. The method for generating electricity according to claim 1, wherein
    the method further using a thermoelectric n-type material having a Heusler alloy type crystal structure and having a structure expressed by General Formula $Fe_2V_{1-z}Al_{1+z}$, the structure based on an $Fe_2VAl$ basic structure having a total number of valence electrons of 24 per chemical formula, wherein z satisfies a condition expressed by $-0.12 \le z \le -0.03$; wherein the thermoelectric n-type material is controlled to have a total number of valence electrons of more than 24 and less than or equal to 24.24 per chemical formula and to act as an n-type material; and wherein the thermoelectric n-type material has a Seebeck coefficient whose absolute value reaches a peak at a temperature of 310 K or higher, and
    electricity is generated by using the thermoelectric material and thermoelectric n-type material at a temperature in a range from 500K to 700K.

6. The method for generating electricity according to claim 2, wherein
    the method further using a thermoelectric n-type material having a Heusler alloy type crystal structure and being based on an $Fe_2VAl$ basic structure having a total number of valence electrons of 24 per chemical formula, wherein the thermoelectric n-type material has a chemical compositional ratio controlled so as to have a structure expressed by General Formula $Fe_2V_{1-z}Al_{1+z}$, where z satisfies a condition expressed by $-0.12 \le z \le -0.03$, and
    electricity is generated by using the thermoelectric material and thermoelectric n-type material at a temperature in a range from 500K to 700K.

* * * * *